United States Patent
Zhou et al.

(10) Patent No.: US 7,206,710 B2
(45) Date of Patent: Apr. 17, 2007

(54) INCREMENTAL GENERATION OF CALIBRATION FACTORS FOR AUTOMATED TEST EQUIPMENT

(75) Inventors: Zhengrong Zhou, Santa Rosa, CA (US); Mike Millhaem, Santa Rosa, CA (US)

(73) Assignee: Verigy Pte. Ltd., Singapore (SG)

( * ) Notice: Subject to any disclaimer, the term of this patent is extended or adjusted under 35 U.S.C. 154(b) by 0 days.

(21) Appl. No.: 11/036,575

(22) Filed: Jan. 14, 2005

(65) Prior Publication Data

US 2006/0161368 A1    Jul. 20, 2006

(51) Int. Cl.
*G06F 19/00* (2006.01)
(52) U.S. Cl. .................. 702/107; 702/106; 702/117; 702/118; 702/120; 714/742; 324/601
(58) Field of Classification Search .................. 702/82, 702/85, 89, 106, 108, 113, 117, 118, 120, 702/122; 324/601; 714/742
See application file for complete search history.

(56) References Cited

U.S. PATENT DOCUMENTS

| | | | |
|---|---|---|---|
| 6,202,186 B1 * | 3/2001 | Oonk | 714/738 |
| 6,567,941 B1 * | 5/2003 | Turnquist et al. | 714/724 |
| 6,804,620 B1 * | 10/2004 | Larson et al. | 702/91 |
| 6,876,938 B2 * | 4/2005 | Kattan | 702/89 |
| 6,931,338 B2 * | 8/2005 | Kattan | 702/89 |
| 2004/0133374 A1 * | 7/2004 | Kattan | 702/85 |
| 2004/0133375 A1 * | 7/2004 | Kattan | 702/89 |
| 2004/0181731 A1 * | 9/2004 | Rajsuman et al. | 714/747 |
| 2004/0236531 A1 * | 11/2004 | Madge | 702/118 |
| 2005/0278597 A1 * | 12/2005 | Miguelanez et al. | 714/738 |

* cited by examiner

*Primary Examiner*—Carol S. W. Tsai

(57) ABSTRACT

In one embodiment, a request to perform a calibration process for automated test equipment (ATE) is received. The request is associated with a calibration parameter set. After receiving the request, one or more signatures for calibration data corresponding to the calibration parameter set are derived, and a determination is made as to whether calibration data corresponding to the signature(s) has already been generated. Thereafter, an incremental set of calibration data is generated, with the generated calibration data i) corresponding to the signature(s), but ii) not having already been generated. In another embodiment, a request to perform a calibration process for ATE is received, and the request is associated with specified test setups. An incremental set of calibration data corresponding to the specified test setups is then generated.

20 Claims, 1 Drawing Sheet

INCREMENTAL GENERATION OF CALIBRATION FACTORS FOR AUTOMATED TEST EQUIPMENT

BACKGROUND

Prior to the manufacture and/or distribution of an electrical device (including a system or component such as a circuit board, integrated circuit, or system-on-a-chip (SOC)), the device is typically tested to determine whether it is built or functions as designed. Often, this testing is performed by automated test equipment (ATE, also called "testers").

For the results of ATE to be meaningful, ATE needs to be calibrated. That is, the intrinsic system errors that ATE may introduce during testing under different conditions and test setups must be quantified. The data which quantifies ATE's intrinsic system errors is often referred to as "calibration data" and may comprise one or more "calibration factors". Once generated, calibration data is used to remove ATE's intrinsic system errors from raw test data.

One way to characterize ATE's intrinsic system errors is to measure them directly. Often, this sort of calibration involves the coupling of various ATE probes to one or more known-good "calibration standards", taking a measurement, and then comparing the measurement result to an expected measurement result.

Another way to characterize ATE's intrinsic system errors is to model them via a mathematic model. Calibration data may then be calculated from the model (although it may still be necessary to acquire certain measurements using one or more calibration standards).

SUMMARY OF THE INVENTION

In one embodiment, a method for generating calibration data for ATE comprises first receiving a request to perform a calibration process for the ATE, the request being associated with a calibration parameter set. One or more signatures for calibration data corresponding to the calibration parameter set are then derived, and a determination is made as to whether calibration data corresponding to the signature(s) has already been generated. Thereafter, an incremental set of calibration data is generated, with the generated calibration data i) corresponding to the signature(s), and ii) not having already been generated.

In another embodiment, a method for generating calibration data for ATE comprises first receiving a request to perform a calibration process for the ATE, the request being associated with specified test setups. An incremental set of calibration data corresponding to the specified test setups is then generated.

Other embodiments are also disclosed.

BRIEF DESCRIPTION OF THE DRAWINGS

Illustrative embodiments of the invention are illustrated in the drawings, in which.

DETAILED DESCRIPTION

In addition to calibrating ATE upon first use, it is also common to calibrate ATE each time its configuration is changed, each time it is used to test a new kind of device, when test setups change, when environmental conditions (e.g., temperature or humidity) change, and periodically (e.g., after so many devices have been tested, or after a certain number of hours of testing).

Figure 1:
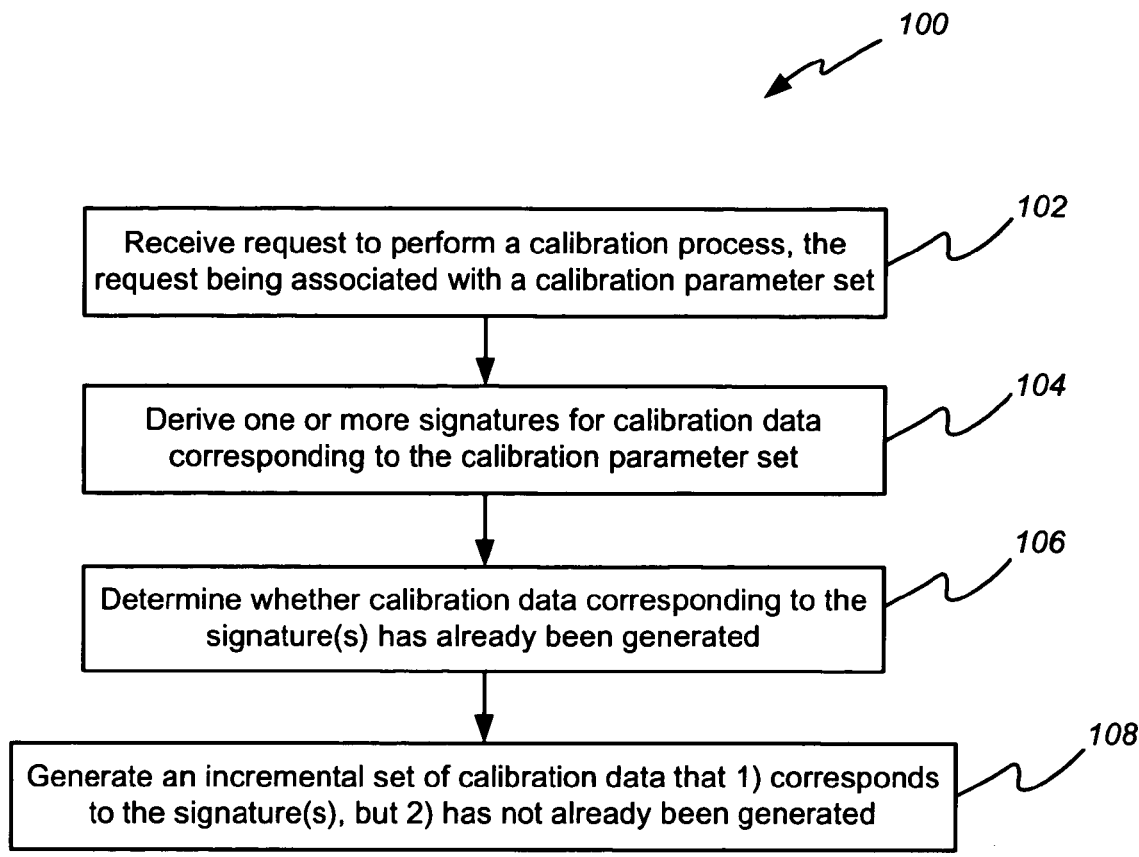
FIG. 1 illustrates a first exemplary method for generating calibration data for ATE.

Until now, ATE has been calibrated in one of two ways—either "as a whole", or based on currently loaded test setups. FIG. 1 illustrates an exemplary alternate method 100 for generating calibration data for ATE. The method 100 begins with the receipt 102 of a request to perform a calibration process for the ATE. However, in contrast to past calibration methods, the request is associated with a calibration parameter set. In some cases, the calibration parameter set may be contained within the request, and in other cases, the calibration parameter set may only be referenced by the request. The types of parameters that may be included within the calibration parameter set include: an indication of one or more testing paths (including, e.g., a stimulus and/or measurement path, and the identification of one or more ATE pins), a temporal indication (e.g., a timestamp or age), one or more testing frequencies (including, e.g., a frequency range), one or more modulation formats, one or more measurement bandwidths, one or more test setups (including, e.g., a subset of fewer than all loaded test setups), one or more power or voltage levels, and/or other parameters.

The parameters of a calibration parameter set may or may not be defined at the time a calibration request is received. For example, a user may request the performance of a calibration process, and at the same time the user may provide or select one or more calibration parameters to/from one or more fields of a user interface. Alternately, a user might specify a calibration parameter set, or rules for deriving a calibration parameter set, in advance of requesting a calibration. For example, a user might specify that each time a calibration is requested, a calibration is to be performed for all currently entered test setups, or all new test setups. Or, a user might specify that each time a calibration is requested, all calibration data older than a certain date is to be regenerated. Then, when a user requests a calibration, software may access the user's prior specifications to determine what parameters should be included in a current calibration parameter set.

In yet another embodiment, software may be configured to periodically calibrate ATE, or to calibrate ATE in response to certain events. In these cases, the software may derive a calibration parameter set without any user input. For example, every 24 hours, software may initiate a calibration request associated with a calibration parameter set including a timestamp indicating which calibration data needs to be regenerated. Or, the software may query ATE for new test setups and then associate a calibration request with a parameter set identifying all currently loaded test setups.

Regardless of the manner in which a request is generated, or the type and number of parameters in a calibration parameter set, the method 100 continues with the derivation 104 of one or more signatures for calibration data corresponding to the parameter set. In one embodiment, the signatures are derived by accessing a set of calibration rules for the ATE (e.g., a set of rules indicating what may be calibrated for the ATE, and at what frequencies, modulation formats, and so on). At or about the same time that the signatures are generated, specific calibration tasks based on the calibration parameter set and calibration rules may be generated, with each task being associated with a corresponding one of the signatures.

At this point, the generated signature(s) may be used to determine 106 whether calibration data corresponding to the signature(s) has already been generated. In one embodiment, this determination is made by indexing a database of calibration data using the signature(s). If this is the first calibration process for the ATE, the database may be empty (i.e., a null set) or may not exist. If the database does not exist, it is instantiated.

In some cases, determining whether calibration data has already been generated may comprise determining whether a particular piece of calibration data has ever been generated. In other cases, determining whether calibration data has already been generated may comprise determining whether a timestamp included with a particular piece of calibration data's associated signature is within a valid range. If not, the calibration data, though generated, is considered not to have been generated (i.e., because calibration data with the correct timestamp has not been generated). Determinations as to whether calibration data has already been generated may also be made in other ways, depending on the types of parameters that are present in calibration data signatures.

After determining whether calibration data corresponding to the derived signature(s) already exists, an incremental set of calibration data that 1) corresponds to the signature(s), but 2) has not already been generated, is generated 108. In one embodiment, the calibration data is generated by executing previously generated calibration tasks. In another embodiment, calibration rules are now accessed to determine an incremental set of calibration tasks that need to be executed.

During or after the generation of an incremental set of calibration data, the generated calibration data may be added to an existing database of calibration data, or may be stored in an incremental database. Preferably, the generated calibration data is stored along with its associated signature(s) so that subsequent executions of the method 100 may index the calibration data to determine whether it already exists (and is still valid).

In some cases, one or more databases of calibration data may be stored within ATE memory. In other cases, one or more databases of calibration data may be stored apart from ATE, thereby freeing the ATE's resources.

Figure 2:
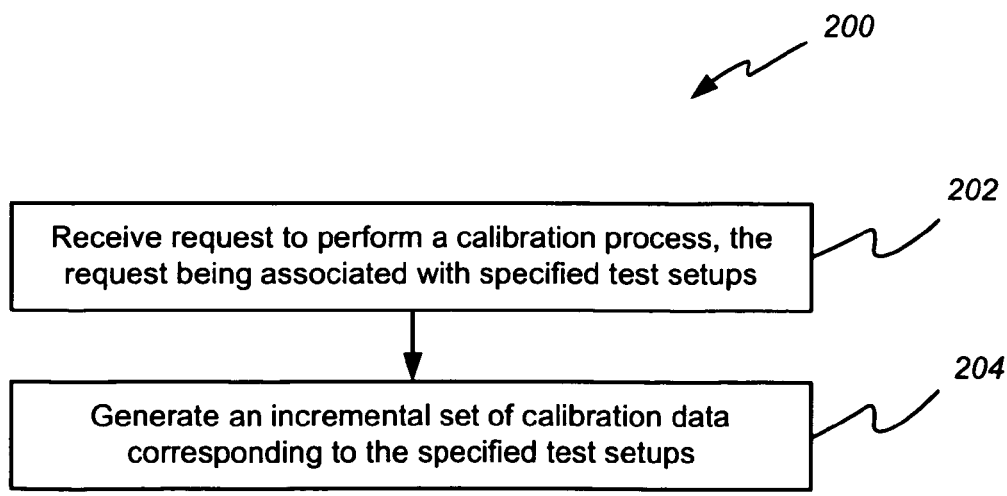
FIG. 2 illustrates a second exemplary method for generating calibration data for ATE.

FIG. 2 illustrates a second exemplary method 200 for generating calibration data for ATE. As in the method 100, the method 200 begins with the receipt 202 of a request to perform a calibration process for the ATE. However, in the method 200, the request is associated with specified test setups. An incremental set of calibration data corresponding to the specified test setups is then generated 204. The test setups may be specified by a user, or alternately, by computer software such as software that determines which test setups are new. In some cases, the method 200 may be integrated with the method 100 so that an incremental set of calibration data is generated in response to both data signatures and specified test setups.

In one embodiment, the methods shown in FIG. 1, FIG. 2, or any variant thereof, may be embodied in sequences of instructions stored on machine-readable media (e.g., one or more fixed disks, removable media such as compact discs (CDs) or digital versatile discs (DVDs), random-access or read only memories, or any combination thereof, whether in a single location, on a single machine, or distributed across a network). When executed by a machine such as a computer system, the sequences of instructions then cause the machine to perform the actions of the method 100 or 200. By way of example, the machine which executes the sequences of instructions may be a system-on-a-chip (SOC) tester, such as the Agilent 93000 SOC Tester, or an integrated circuit tester, such as the Agilent 84000 Radio Frequency (RF) Integrated Circuit tester. The 93000 and 84000 are both available from Agilent Technologies, Inc., which is headquartered in Palo Alto, Calif., USA.

Wholesale calibration of ATE can be extremely time-consuming. The use of incremental calibration can therefore save a significant amount of time during device testing.

What is claimed is:

1. A method for generating calibration data for automated test equipment (ATE), comprising:
    receiving a request to perform a calibration process for the ATE, said request being associated with a calibration parameter set;
    deriving one or more signatures for calibration data corresponding to the calibration parameter set;
    determining whether calibration data corresponding to the signature(s) has already been generated; and
    generating an incremental set of calibration data for automated test equipment (ATE) that i) corresponds to the signature(s), but ii) has not already been generated so as to save a significant amount of time during device testing.

2. The method of claim 1, wherein the signature(s) are derived by accessing a set of calibration rules for the ATE.

3. The method of claim 2, wherein calibration data is generated by executing calibration tasks based on ones of the calibration rules corresponding to the calibration parameter set.

4. The method of claim 1, wherein determining whether calibration data corresponding to the signature(s) has already been generated comprises indexing a database of calibration data using the signatures; the method further comprising storing generated calibration data and corresponding signatures in the database.

5. The method of claim 1, wherein the database of calibration data is initially a null set.

6. The method of claim 1, wherein the request to perform the calibration process for the ATE is further associated with specified test setups; and
    wherein the incremental set of calibration data is limited to calibration data that also corresponds to the specified test setups.

7. The method of claim 1, wherein the calibration parameter set and signature(s) comprise a testing path.

8. The method of claim 1, wherein the calibration parameter set and signature(s) comprise a temporal indication.

9. The method of claim 8, wherein the temporal indication comprises at least one of: a timestamp and an age.

10. The method of claim 1, wherein the calibration parameter set and signature(s) comprise a testing frequency.

11. The method of claim 1, wherein the calibration parameter set and signature(s) comprise a modulation format.

12. The method of claim 1, wherein the calibration parameter set and signature(s) comprise a measurement bandwidth.

13. The method of claim 1, wherein the calibration data comprises radio frequency (RF) calibration data.

14. A number of machine-readable media having stored thereon sequences of instructions that, when executed by a machine, cause the machine to perform the actions of:
    receiving a request to perform a calibration process for the ATE, said request being associated with a calibration parameter set;
    deriving one or more signatures for calibration data corresponding to the calibration parameter set;
    determining whether calibration data corresponding to the signature(s) has already been generated; and generating an incremental set of calibration data that i) corresponds to the signature(s), but ii) has not already been generated, so as to save a significant amount of time during device testing.

15. The machine-readable media of claim 14, wherein the sequences of instructions further cause the machine to present a user interface to a user, the user interface providing at least one field for receiving said request.

16. The machine-readable media of claim 14, wherein the signature(s) are derived by accessing a set of calibration rules for the ATE.

17. The machine-readable media of claim 16, wherein calibration data is generated by executing calibration tasks based on ones of the calibration rules corresponding to the calibration parameter set.

18. The machine-readable media of claim 14, wherein determining whether calibration data corresponding to the signature(s) has already been generated comprises indexing a database of calibration data using the signature(s); the sequences of instructions further causing the machine to store generated calibration data and corresponding signatures in the database.

19. The machine-readable media of claim 14, wherein the calibration parameter set and signature(s) comprise at least one of: a testing path, a temporal indication, a testing frequency, a modulation format, and a measurement bandwidth.

20. A computer-implemented method for generating calibration data for automated test equipment (ATE), comprising:

receiving a request to perform a calibration process for the ATE, said request being associated with specified test setups;

determining whether calibration data associated with the specified test setups already exists; and generating an incremental set of calibration data corresponding to said specified test setups for automated test equipment (ATE), the incremental set of calibration data not including calibration data that has been determined to already exist, so as to save a significant amount of time during device testing.

\* \* \* \* \*